US008900033B2

(12) United States Patent
Takaishi et al.

(10) Patent No.: US 8,900,033 B2
(45) Date of Patent: Dec. 2, 2014

(54) WAFER POLISHING METHOD

(75) Inventors: Kazushige Takaishi, Tokyo (JP);
Keiichi Takanashi, Tokyo (JP);
Tetsurou Taniguchi, Tokyo (JP);
Shinichi Ogata, Tokyo (JP); Shunsuke Mikuriya, Tokyo (JP)

(73) Assignee: Sumco Corporation, Tokyo (JP)

( * ) Notice: Subject to any disclaimer, the term of this patent is extended or adjusted under 35 U.S.C. 154(b) by 257 days.

(21) Appl. No.: 13/261,294

(22) PCT Filed: Nov. 30, 2010

(86) PCT No.: PCT/JP2010/071777
§ 371 (c)(1),
(2), (4) Date: May 23, 2012

(87) PCT Pub. No.: WO2011/068236
PCT Pub. Date: Jun. 9, 2011

(65) Prior Publication Data
US 2013/0017763 A1 Jan. 17, 2013

(30) Foreign Application Priority Data

Dec. 1, 2009 (JP) ................................. 2009-273255
Dec. 4, 2009 (JP) ................................. 2009-276517

(51) Int. Cl.
*B24B 1/00* (2006.01)
(52) U.S. Cl.
USPC ........ 451/5; 451/9; 451/10; 451/41; 451/262; 451/268
(58) Field of Classification Search
CPC ........ B24B 7/17; B24B 37/08; B24B 37/013; B24B 7/228; B24B 11/06; B24B 41/04; B24B 41/37; B24B 41/013

USPC ................ 451/5, 9, 10, 26, 41, 262, 269, 268
See application file for complete search history.

(56) References Cited

U.S. PATENT DOCUMENTS 3,093,937 A * 6/1963 Balamuth et al. ............. 451/165
3,097,458 A * 7/1963 Richmond ......................... 451/8
(Continued)

FOREIGN PATENT DOCUMENTS

JP        H0645299 U     6/1994
JP        9-139369 A     5/1997
(Continued)

OTHER PUBLICATIONS

Office Action in corresponding German application No. 11 2010 004 635.2, dated May 26, 2014 (8 pages).

*Primary Examiner* — George Nguyen
(74) *Attorney, Agent, or Firm* — Thomas J. Engellenner; Reza Mollaaghababa; Pepper Hamilton LLP

(57) ABSTRACT

An object of the present invention is to provide a method of polishing silicon wafers, capable of suppressing generation of undesired sounds from carriers and reducing the thickness variation of the wafers after polished.

The method is a wafer polishing method in which wafers 20 are polished by supplying a polishing solution to surfaces 30*a* of a pair of polishing pads 30 positioned above and below carriers 10 each having a circular hole 11 for retaining the wafers 20, the carriers 10 being thinner than the wafers 20; and sliding the polishing pads 30 relatively to the carriers 10, thereby simultaneously polishing both surfaces of the wafers 20 retained in the carriers 10. The method is characterized in that information sourced from the carriers 10 when a difference between the thickness of the carriers 10 and the thickness of the wafers 20 reaches a predetermined value is detected to calculate the thickness of the wafers 20, thereby terminating polishing.

11 Claims, 5 Drawing Sheets

(56) References Cited

U.S. PATENT DOCUMENTS

| | | | |
|---|---|---|---|
| 3,348,338 A * | 10/1967 | Messerschmidt | 451/65 |
| 3,579,922 A * | 5/1971 | Mandonas et al. | 451/9 |
| 4,197,676 A * | 4/1980 | Sauerland | 451/1 |
| 4,272,924 A * | 6/1981 | Masuko et al. | 451/1 |
| 5,099,614 A * | 3/1992 | Arai et al. | 451/8 |
| 5,222,329 A * | 6/1993 | Yu | 451/11 |
| 5,876,265 A | 3/1999 | Kojima | |
| 5,882,245 A * | 3/1999 | Popovich et al. | 451/41 |
| 5,941,759 A * | 8/1999 | Kitajima et al. | 451/41 |
| 6,074,275 A * | 6/2000 | Yashiki et al. | 451/5 |
| 6,155,908 A * | 12/2000 | Hakomori | 451/28 |
| 6,210,259 B1 * | 4/2001 | Malkin et al. | 451/166 |
| 6,431,953 B1 | 8/2002 | Carter et al. | |
| 6,709,981 B2 * | 3/2004 | Grabbe et al. | 438/692 |
| 7,137,867 B2 * | 11/2006 | Nagayama et al. | 451/5 |
| 7,147,541 B2 * | 12/2006 | Nagayama et al. | 451/5 |
| 8,113,913 B2 * | 2/2012 | Pietsch et al. | 451/7 |
| 8,125,654 B2 * | 2/2012 | Benvegnu et al. | 356/630 |
| 8,221,190 B2 * | 7/2012 | Tokura et al. | 451/5 |
| 8,267,741 B2 * | 9/2012 | Kimura et al. | 451/5 |
| 2002/0052064 A1 | 5/2002 | Grabbe et al. | 438/113 |
| 2002/0065024 A1 * | 5/2002 | Fitzgerald et al. | 451/41 |
| 2004/0192171 A1 * | 9/2004 | Koike | 451/5 |
| 2006/0194511 A1 * | 8/2006 | Nagayama et al. | 451/5 |
| 2006/0194512 A1 * | 8/2006 | Nagayama et al. | 451/5 |
| 2008/0233840 A1 * | 9/2008 | Pietsch et al. | 451/41 |
| 2011/0064971 A1 * | 3/2011 | Kimura et al. | 428/846.9 |
| 2012/0252319 A1 * | 10/2012 | Fujihira | 451/8 |
| 2013/0017763 A1 * | 1/2013 | Takaishi et al. | 451/5 |
| 2013/0109180 A1 * | 5/2013 | Tanimoto et al. | 438/692 |

FOREIGN PATENT DOCUMENTS

| | | |
|---|---|---|
| JP | H09139369 A | 5/1997 |
| JP | 9-150367 A | 6/1997 |
| JP | H09150367 A | 6/1997 |
| JP | 2001-007063 A | 1/2001 |
| JP | 2001015467 A | 1/2001 |
| JP | 2005501410 A | 1/2005 |
| JP | 2005252000 A | 9/2005 |
| JP | 2005252000 A | 9/2005 |
| JP | 2006303136 A | 11/2006 |
| TW | 546724 B | 8/2003 |
| TW | 200940693 A | 10/2009 |
| WO | 2003019627 | 3/2003 |
| WO | WO-2009041697 A1 | 4/2009 |

* cited by examiner (a)

(b)

WAFER POLISHING METHOD

TECHNICAL FIELD

The present invention relates to a wafer polishing method and, in particular to a method of simultaneously polishing both surfaces of wafers by rotating carriers retaining the wafers between an upper polishing plate and a lower polishing plate provided with a polishing pad on each surface.

RELATED ART

For a process of polishing silicon wafers, a polishing method of forcing an upper polishing plate and a lower polishing plate that are provided with a polishing pad on their surface against wafers retained by carriers and moving the wafers between the upper polishing plate and the lower polishing plate that are rotated, thereby simultaneously polishing both surfaces of the wafers has been generally employed. The carriers each have a circular hole for retaining the wafers, and have a smaller thickness than the wafers. In this polishing method, a polishing solution containing abrasive grains has been generally used. This polishing method has been used because surfaces and rear surfaces of a plurality of wafers can be simultaneously polished and accordingly productivity and flatness of the surfaces and the rear surfaces of the wafers can be improved.

The above polishing method using carriers and a polishing solution containing abrasive grains however has a problem in that the carriers are worn by the abrasive grains contained in the polishing solution, and the thicknesses of the carriers vary, which would lead to thickness variation of the wafers after polished.

Patent Document 1 discloses carriers for a double-side polishing apparatus capable of preventing the carriers from wearing at the time of simultaneously polishing both surfaces of wafers. However, the carriers for a double-side polishing apparatus in Patent Document 1 are carriers each made by coating the surface of a resin matrix with a DLC (diamond-like carbon) film. Therefore, the production cost is extremely high as compared with metal carriers, carriers each having a metal plate of which surface and rear surface are coated with resin, and resin carriers, which are commonly used. This has been a problem.

In cases where a polishing solution free of abrasive grains is used as a polishing solution for simultaneously polishing both surfaces of wafers, whichever of the following carriers may be used to prevent the carriers from wearing: metal carriers, carriers each having a metal plate of which surface and rear surface are coated with resin, and resin carriers. However, as polishing proceeds, the difference between the thickness of the carriers and the thickness of the wafers becomes small, and polishing pads contact the carriers to cause the carrier to vibrate, which results in undesired sounds generated from the carriers. This has been another problem.

When polishing is performed in a state where carriers continue to vibrate, not only the problem of undesired sounds being generated from the carriers arises, but the variation of the wafer thickness that should be reduced by polishing would conversely increase as a result of the variation in the contact of polishing pads with both surfaces of the wafers, which is yet another problem. Therefore, the time point at which the carriers begin to vibrate should be ensured to be detected, and polishing is required to be terminated at the time point.

Patent Document 2 discloses a method of simultaneously polishing both surfaces of wafers by moving the wafers retained by carriers between upper and lower polishing plates that are rotated. In the polishing method, from vibrations generated from the polishing plates accompanying wafer polishing, one or a plurality of specific frequencies at which the vibration level changes reflecting the progression of polishing are selected in advance, and the change in the vibration level at the specific frequencies is detected in polishing, so that the termination point of polishing is estimated from the change in the vibration level.

Further, in other polishing methods in which polishing is terminated with the use of polishing sounds generated when wafers are polished, polishing sounds generated in polishing of wafers are detected, and the termination point of polishing is determined based on a change in the polishing sounds, for example as disclosed in Patent Documents 3 and 4. In accordance with this method, the termination point of polishing can be determined during the progress of a polishing process using a relatively simple system configuration.

Patent Documents

Patent Document 1: Japanese Patent Application Publication No. 2006-303136
Patent Document 2: Japanese Patent Application Publication No. 2005-252000
Patent Document 3: Japanese Patent Application Publication No. H6-45299
Patent Document 4: Japanese Patent Application Publication No. 2001-15467

DISCLOSURE OF THE INVENTION

Problems to be Solved by the Invention

However, in the invention of Patent Document 2, in fact, a vibration sensor provided on an upper surface of an upper polishing plate detects not only vibrations of polishing plates but also the total vibrations including vibrations of the polishing plates, vibrations of wafers, and vibrations of carriers. Therefore, noise is mixed in the detected specific frequencies at which the vibration level changes; as a result, the change in the vibration level cannot be accurately measured. Thus, the termination point of polishing cannot be accurately detected, which would lead to further variations in the thickness of the wafers polished.

Further, in the inventions of Patent Documents 3 and 4, while the termination point can be quantitatively determined, cases of polishing using carriers are not considered. Thus, the thickness variation of wafers after polished due to wear of the carriers still remains as a problem to be solved.

An object of the present invention is to provide a method of polishing silicon wafers, capable of suppressing undesired sounds generated from carriers and reducing the thickness variation of the wafers after polished.

Means for Solving the Problem

In order to solve the above problems, the inventors of the present invention have made various studies on a wafer polishing method including the steps of supplying a polishing solution to a surface of a pair of polishing pads positioned above and below a carrier which has a circular hole for retaining a wafer and is thinner than the wafer; and sliding the polishing pads relatively to the carrier, thereby simultaneously polishing both surfaces of the wafer retained in the carrier. As a result, the inventors found the following facts. The carrier generates information such as vibrations or sounds when the difference between the thickness of the carrier and the thickness of the wafer reaches a specific value. And by detecting the information, the thickness of the wafer can be determined. Furthermore, the termination of polishing based on the determined thickness allows the polishing amount of the wafer to be stably controlled; therefore, undesired sounds generated from the carrier can be effectively suppressed, and a wafer after polished with reduced thickness variation can be obtained.

In order to achieve the above object, the present invention primarily includes the following components.

(1) A wafer polishing method comprising the steps of: supplying a polishing solution to a surface of a pair of polishing pads positioned above and below a carrier which has a circular hole for retaining a wafer and is thinner than the wafer; and sliding the polishing pads relatively to the carrier, thereby simultaneously polishing both surfaces of the wafer retained in the carrier. Information sourced from the carrier when a difference between a thickness of the carrier and a thickness of the wafer reaches a predetermined value, is detected to calculate the thickness of the wafer and thereby terminate polishing.

(2) The wafer polishing method according to (1) above, wherein the termination of polishing is performed at a termination point of polishing determined by extracting a first signal and a second signal that are signals of two setup frequency ranges from the information obtained from the carrier, and detecting the termination point of polishing where an intensity of the first signal is higher than a predetermined value and an intensity of the second signal is lower than a predetermined value.

(3) The wafer polishing method according to (1) above, wherein the polishing solution is a polishing solution free of abrasive grains.

(4) The wafer polishing method according to (1) above, wherein the information sourced from the carrier is sounds and/or vibrations.

(5) The wafer polishing method according to (1) above, wherein the difference between the thickness of the carrier and the thickness of the wafer at a time when the information is sourced, is in the range of 0.1 μm to 20 μm.

(6) The wafer polishing method according to (1) above, wherein a pressure applied to the polishing pads in the direction perpendicular to the surfaces of the wafer is in the range of 100 g/cm² to 300 g/cm².

(7) The wafer polishing method according to (1) above, wherein the information sourced from the carrier is detected with detectors provided for each carrier.

(8) The wafer polishing method according to (7) above, wherein the detector is provided on a mechanism for holding the carrier.

(9) The wafer polishing method according to (8) above, wherein the detector is provided on external gears for moving the carrier.

(10) The wafer polishing method according to (4) above, wherein the detection of the sounds from the carrier is performed by detecting sounds having a frequency of 10 Hz to 1000 Hz.

(11) The wafer polishing method according to (1) above, wherein the polishing solution contains a specific high molecular weight component.

(12) The wafer polishing method according to (2) above, wherein the extracting the signals from the information is calculation of a power spectra of digital data obtained by A/D converting the detected information and of a mean value or a maximum value of signal intensities of power spectra corresponding to the setup frequency ranges.

Effect of the Invention

The present invention can provide a polishing method capable of suppressing undesired sounds generated from carriers and further reducing thickness variation of wafers after polished.

BRIEF DESCRIPTION OF THE DRAWINGS

FIG. 3(a) is a graph showing the intensity of sounds generated from the carriers, and FIG. 3(b) is a graph showing the intensity of vibrations generated from the carriers.

BEST MODE FOR CARRYING OUT THE INVENTION

A wafer polishing method of the present invention will be described with reference to the drawings.

Figure 1:
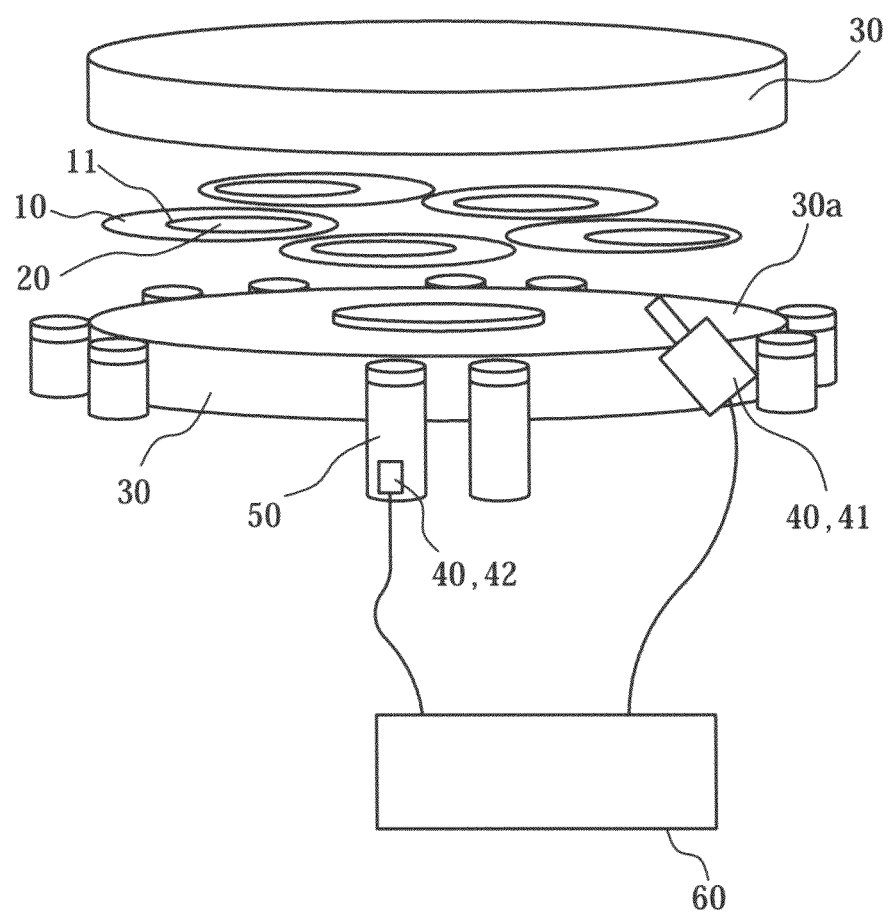
FIG. 1 is a diagram for illustrating a state of polishing wafers.

A wafer polishing method of the present invention is a method in which wafers 20 are polished by supplying a polishing solution (not shown) to surfaces 30a of a pair of polishing pads 30 positioned above and below carriers 10 each having a circular hole 11 for retaining the wafers 20, the carriers 10 being thinner than the wafers 20; and sliding the polishing pads 30 relatively to the carriers 10, thereby simultaneously polishing both surfaces of the wafers 20 retained in the carriers 10 as shown in FIG. 1.

The method is characterized in that information sourced from the carriers 10 when a difference between the thickness of the carriers 10 and the thickness of the wafers 20 reaches a predetermined value, is detected to calculate the thickness of the wafers 20, and thereby terminate polishing.

Figure 2:
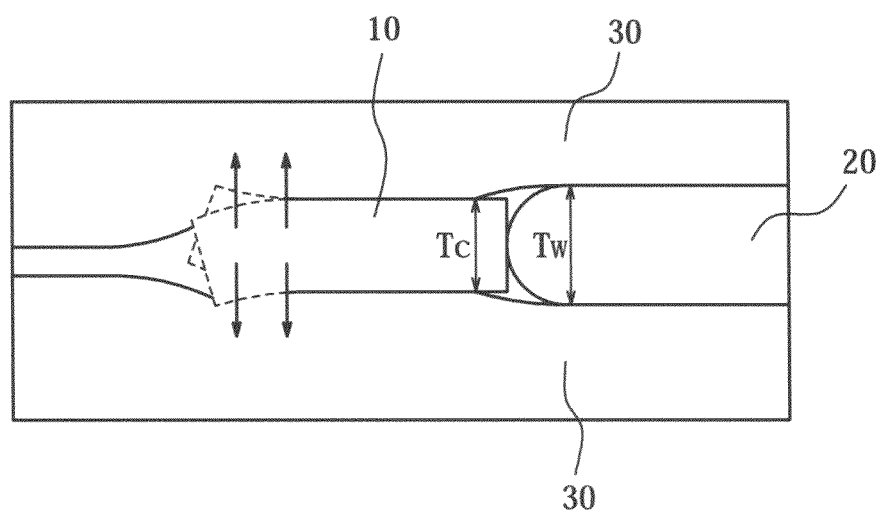
FIG. 2 is a cross-sectional view for illustrating a state of members in wafer polishing with respect to one embodiment of a wafer polishing method in accordance with the present invention.

With the above structure, as shown in FIG. 2, information sourced from the carriers 10 when a difference between the thickness TC of the carriers 10 and the thickness TW of the wafers 20 reaches a predetermined value (in FIG. 2, information sourced due to vibrations of the carriers 10 in the directions indicated by the arrows) is detected to calculate the thickness of the wafers 20, thereby making it possible to appropriately terminate polishing. Thus, control of the polishing amount of the wafers 20 can be ensured, so that the wafers 20 having been polished with reduced thickness variation can be obtained.

Figure 3:
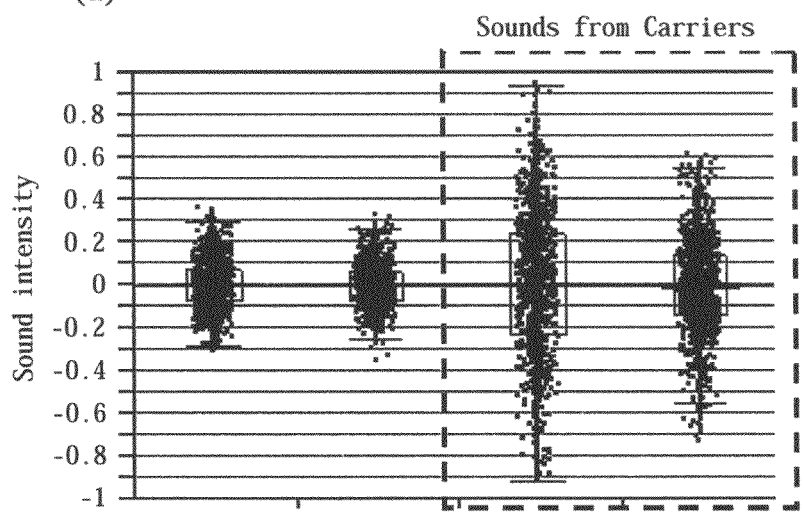
FIGS. 3(a) and 3(b) are graphs showing the intensity of information generated from carriers. Specifically.
Figure 3:
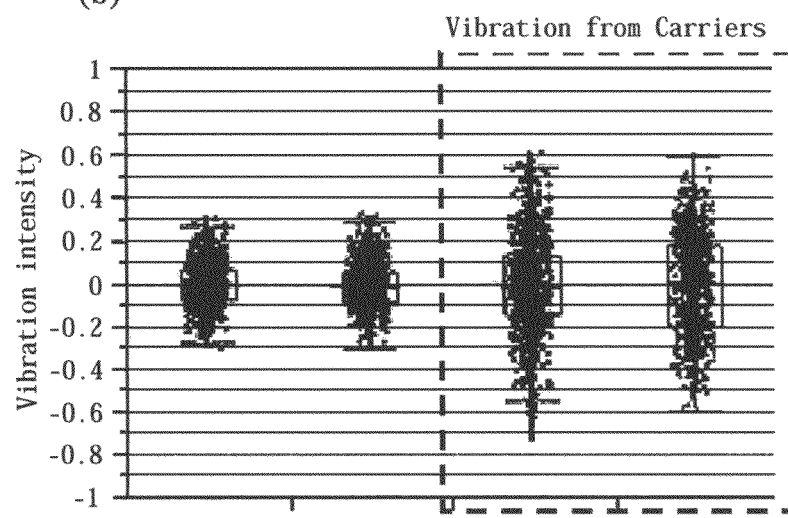

FIGS. 3(a) and 3(b) are graphs showing the intensity of information (herein referring to sounds and vibrations) for both cases where carriers are and are not generating information (sounds and vibrations). FIG. 3(a) shows data of sounds generated from the carriers. FIG. 3(b) shows data of vibrations generated from the carriers. The portions enclosed by broken lines in FIGS. 3(a) and 3(b) show the situations where sounds and vibrations are generated from the carriers, respectively. The relevant portions show that the intensities of sounds and vibrations are higher than those in cases where the information is not sourced. Therefore, for example, the sounds and vibrations generated when the thickness of the wafers 20 is desirable are perceived in advance, and polishing is terminated when the relevant sounds and vibrations are achieved. Thus, polishing can be accurately controlled.

Further, the termination of polishing is preferably performed at a termination point of polishing determined by acquiring the information sourced from the carriers 10 when the difference between the thickness of the carriers 10 and the thickness of the wafers 20 reaches a predetermined value, and extracting a first signal and a second signal that are signals of two setup frequency ranges from the information obtained, to detect the termination point of polishing where the intensity of the first signal is higher than a predetermined value and the intensity of the second signal is lower than a predetermined value.

The first signal and the second signal extracted from the information refer to two signals of different frequency ranges that are extracted, after acquisition of the information sourced from the carriers 10, from the acquired information by a specific process. In the present invention, a signal of high frequency is referred to as a first signal, while a signal of low frequency is referred to as a second signal. Note that the frequencies of the first signal and the second signal are not particularly limited and may be any value as long as the termination of polishing can be controlled by a combination of the first signal and the second signal.

Figure 4:
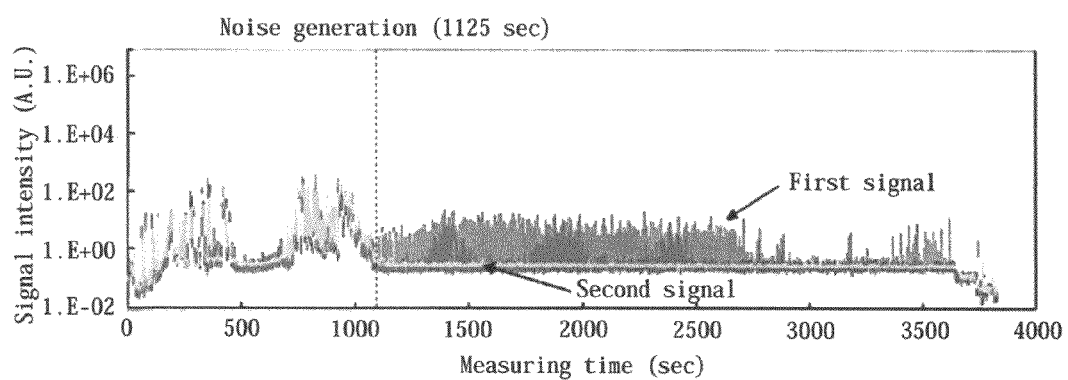
FIG. 4 is a graph showing the relationship between the elapsed time (second) and the intensity (A.U.) of signals (first signal and second signal) of two frequency ranges, extracted from the information sourced from carriers in polishing.

FIG. 4 is a graph showing the relationship between the elapsed time (second) and the intensity (A.U.) of the signals (first signal and second signal) of the two frequency ranges, extracted from information (vibrations) sourced from the carriers 10 in polishing. As is also clear from FIG. 4, until undesired sounds are generated from the carriers, the intensities of both the first signal and the second signal fluctuate; however, while the intensity of the first signal is high at the point where undesired sounds are generated, the intensity of the second signal remains low. Therefore, setting the intensity (predetermined value) which the first signal should exceed and the intensity (predetermined value) which the second signal should fall behind allows the termination point of polishing to be quantitatively determined.

Figure 5:
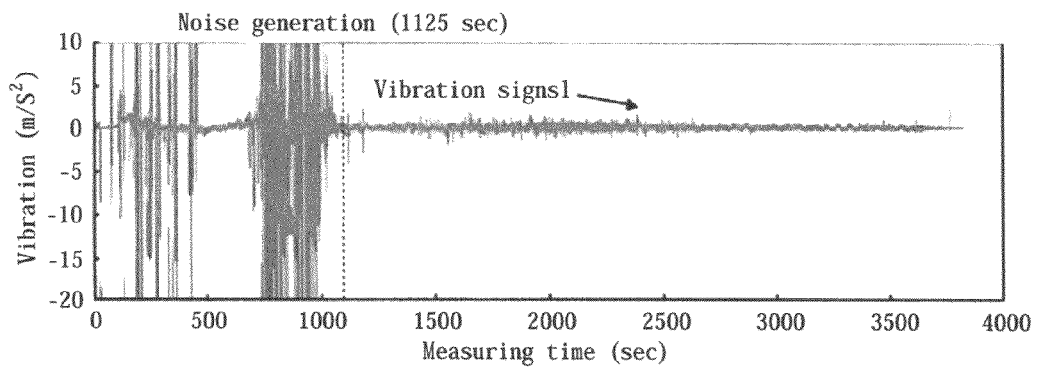
FIG. 5 is a graph showing the relationship between the elapsed time (second) and the intensity (m/s²) of signals of vibrations generated from carriers in polishing.

On the other hand, FIG. 5 is a graph showing the relationship between the elapsed time (second) and the intensity (m/s$^2$) of the signals of vibrations generated from the carriers in polishing. When only vibration signals are detected, many peaks of similar intensity are shown (0 to 480 seconds, 700 seconds to 1000 seconds), which makes it impossible to ascertain the timing when undesired sounds are generated from the above-mentioned carriers. Thus, the termination point of polishing cannot be determined.

The information sourced from the carriers 10 is not particularly limited and may be, for example, sounds, vibrations, or heat generated from the carriers as long as the thickness TW of the wafers can be determined based on the information. However, the information is preferably sounds and/or vibrations generated from the carriers 10 because the termination point of polishing the wafers 20 can be easily and reliably detected.

Note that the method of extracting signals from the information is not particularly limited as long as the above-mentioned first signal and second signal can be effectively extracted with the method. For example, since desired signal data can be obtained relatively easily, it is preferable to perform the signal extraction by calculating power spectra of digital data obtained by A/D converting the detected information, and by calculating a mean value or a maximum value of signal intensities of power spectra corresponding to the setup frequency ranges. And if necessary, only specified frequencies may be A/D converted by filtering the information, or the peak hold processing may be conducted after such filtering.

Further, since the polishing amount can be more accurately controlled, a difference between the thickness TC of the carriers 10 and the thickness TW of the wafers 20 (TC-TW) at the time when information is sourced from the carriers 10, is preferably in the range of 0.1 μm to 20 μm although depending on the rotation speed of the polishing pads 30, pressure, and the type of the polishing solution as well.

The information (sounds or vibrations and the like) sourced from the carriers 10 can be detected, for example with detectors 40 provided adjacent to the carriers 10 as shown in FIG. 1. Here, the detectors 40 may be, for example, a sound input microphone 41 and vibration detectors 42 shown in FIG. 1.

When the information to be detected is sounds, their frequencies are preferably in the range of 10 Hz to 1000 Hz. The frequency range is expected to be suitable for finding the termination point of polishing; therefore, if polishing is terminated with sounds outside the frequency range, desired wafer thickness would not be achieved.

Further, the frequency range of the first signal is more preferably in the range of 200 Hz to 1000 Hz, while the frequency range of the second signal is more preferably in the range of 10 Hz to 200 Hz. The first signal and the second signal of these wavelength ranges make it possible to ensure determination of the termination point of polishing when undesired sounds are generated from the carriers 10 because their signal intensities greatly differ from one another.

Meanwhile, when vibrations generated from the carriers 10 are detected, as shown in FIG. 1, the vibration detectors 42 are preferably provided on a mechanism (in FIG. 1, external gears 50, which are members used for moving the carriers 10) for holding the carriers 10 to detect the information sourced from the carriers 10. This is because it is difficult to detect the vibrations of the carriers 10 itself being interposed between the polishing pads 30, and it is easier to detect the vibrations of the external gears 50, thereby ensuring easy acquisition of the information from the carriers 10.

Further, the detected sounds and/or vibrations generated from the carriers 10 are converted into signals, and the signals are sent to a control device 60 as shown in FIG. 1, so that the first signal and the second signal are extracted using the control device 60; whether to continue or terminate polishing can also be determined in this manner.

The carriers 10 used in a polishing method of the present invention are, as shown in FIG. 1, members for retaining the wafers 20 to be polished, which each include a circular hole for retaining the wafers 20. The thickness TC is smaller than the thickness TW of the wafers 20. The shape and properties of the carriers 10 are not particularly limited, and carriers commonly used for polishing both surfaces of wafers may be used. The carriers 10 preferably have such properties as high wear resistance, a small coefficient of friction with polishing cloth, and high acid resistance or high alkali resistance. The carriers 10 may be made of, for example, a fiber reinforced plastic, that is, a combination of resin such as epoxy resin, phenol resin, or polyimide resin and reinforcement fiber such as glass fiber, carbon fiber, or aramid fiber.

The polishing pads 30 are members for sliding the wafers 20 being interposed between the upper and lower polishing pads to simultaneously polish the surfaces of the wafers 20, as shown in FIG. 1 and FIG. 2. The polishing pads 30 preferably have properties such as a small coefficient of friction with the wafers 20 and the carriers 10. For example, an urethane material having a hardness (Shore D) of 75 to 85 with a compressibility of 2% to 3% may be used. When the polishing solution does not contain abrasive grains therewithin, the polishing pads 30 are preferably polishing pads having fixed abrasive grains. Fixed abrasive grains here refer to solid bodies made of a different material from the polishing pad matrix that are fixed to a surface of the polishing pads, and the abrasive grains used may be made of, for example, a ceramic such as silica or alumina; diamond, silicon carbide, or a compound thereof; or a high molecular weight polymer such as polyethylene or polypropylene. Further, their shapes are not limited to particulate form, and may be in the form of solid, gel, or the like. Furthermore, kinds of silica that can be used may be, for example, prepared by either a dry process (combustion process/arc process) or a wet process (sedimentation process/sol-gel process).

A polishing solution used in a polishing method of the present invention is preferably a polishing solution free of abrasive grains. Use of a polishing solution containing abrasive grains makes it difficult to detect information from the carriers 10 that is required for the termination of polishing. Here, the "polishing solution free of abrasive grains" is polishing solution in which abrasive grain components may be contained but such abrasive grain components are not positively added.

Figure 6:
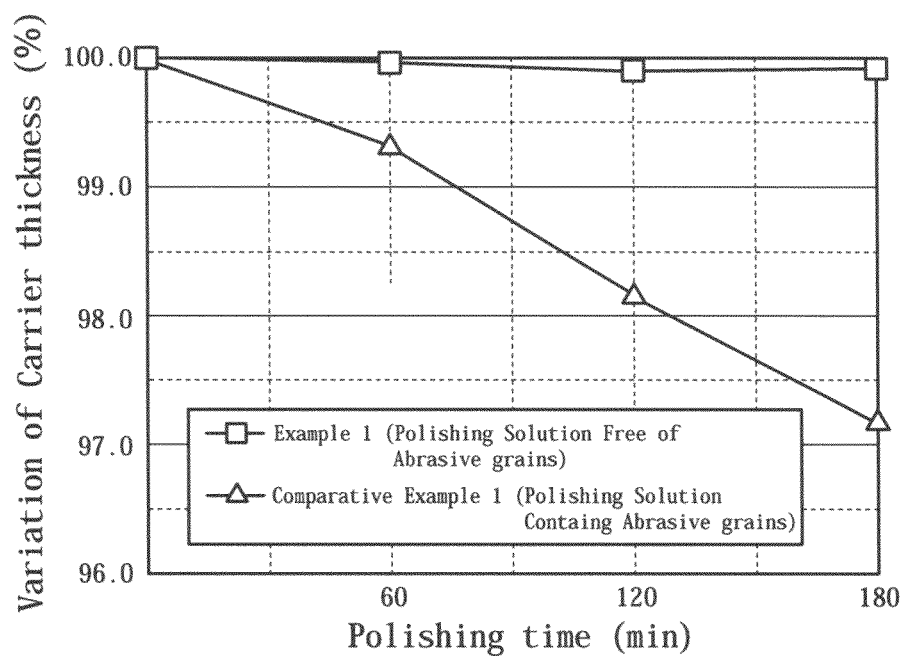
FIG. 6 is a graph showing the relationship between polishing time (min) and thickness variation (%) of carriers with respect to a case of wafer polishing using a polishing solution free of abrasive grains and a case of wafer polishing using a polishing solution containing abrasive grains.

FIG. 6 is a graph showing the relationship between polishing time (min) and thickness variation (%) of carriers in cases of polishing wafers using a polishing solution containing abrasive grains and a polishing solution free of abrasive grains. FIG. 6 shows that the carriers are more worn out in the case of using the polishing solution containing abrasive grains.

The type of the polishing solution is not particularly limited. For example, an alkaline aqueous solution with pH controlled to the range of 8 to 14 is preferably used. With a pH of less than 8, the etching action is weak to reduce the polishing rate; on the other hand, with a pH of more than 14, handling of the polishing solution becomes difficult. The alkaline aqueous solution may be an aqueous ammonia solution, or an alkaline hydroxide solution such as potassium hydroxide or sodium hydroxide, or an alkaline carbonate solution. Alternatively, an aqueous solution of hydrazine or amines can be used. It is preferable to use an aqueous solution of amines in particular in terms of increasing the polishing rate. Further, the polishing solution preferably contains a specific high molecular weight component, since undesired sounds (squeals) generated from the carriers 10 can be further reduced. The type of the high molecular weight component is not particularly limited, but hydroxyethyl cellulose or polyethylene glycol is preferably used. In particular, hydroxyethyl cellulose, which has a relatively high molecular weight, can efficiently reduce the coefficient of friction between the polishing pads 30 and the carriers 10 due to the bearing action between the polishing pads 30 and the carriers 10. As a result, defects in wafers after polished can be reduced. Further, the concentration of the high molecular weight component added to the polishing solution is preferably in the range of 0.01 ppm to 1000 ppm. If the concentration of the high molecular weight component is less than 0.01 ppm, the friction coefficient in polishing is high, which would cause defects in the surface of the wafers after polished. On the other hand, if the concentration is more than 1000 ppm, the polishing rate is significantly reduced, and considerable time is required for mirror polishing.

In terms of removing metal ions contained in the polishing solution, a chelating agent is preferably added to the polishing solution. The chelating agent may be any substance without particular limitation as long as it has a chelating effect on metal ions. For example, a phosphonic acid type chelating agent, an aminocarboxylic acid type chelating agent, or the like can be used. Considering the solubility in an alkaline aqueous solution, an aminocarboxylic acid type chelating agent is preferable. In addition, considering chelating effect on heavy metal ions, an aminocarboxylic acid salt such as ethylenediaminetetraacetic acid (EDTA) or diethylenetriaminepentaacetic acid (DTPA) is more preferable. The concentration of the chelating agent is preferably in the range of 0.1 ppm to 1000 ppm, which allows metal ions such as Cu, Zn, Fe, Cr, Ni, and Al to be trapped.

Further, in a polishing method of the present invention, the polishing pads 30 are slid relatively to the carriers 10, thereby polishing surfaces of the silicon wafers 20. The sliding method is not necessarily limited in particular. The sliding may be performed by moving only the polishing pads 30 or by moving only the carriers 10; alternatively, the sliding may be performed by relatively moving both the polishing pads 30 and the carriers 10.

The pressure applied to the polishing pads 30 in the direction perpendicular to the surfaces of the wafers 20 is preferably in the range of 100 $g/cm^2$ to 300 $g/cm^2$. When the pressure is less than 100 $g/cm^2$, the pressure is excessively low, so that the information sourced from the carriers 10, such as sounds and vibrations would not be sufficiently obtained. On the other hand, when the pressure is more than 300 $g/cm^2$, the excessively high pressure makes sounds and vibrations of the carriers 10 be easily generated; thus, the polishing termination point of the wafers 20 would not be accurately ascertained.

Note that the foregoing descriptions merely illustrate some examples of embodiments of the present invention and various modifications can be made thereto within the scope of claims.

EXAMPLES

Example 1

In Example 1, as shown in FIG. 1, silicon wafers 20 having a diameter of 300 mm were polished by a wafer polishing method including the steps of supplying a polishing solution free of abrasive grains (a potassium hydroxide aqueous solution containing ethylenediaminetetraacetic acid at a concentration of 10 ppm as a chelating agent, and hydroxyethyl cellulose at a concentration of 1 ppm as a high molecular weight component) to a surface of a pair of polishing pads 30 made of urethane positioned above and below carriers 10 each having a circular hole 11 for retaining the wafers 20, the carriers 10 being 750 μm in thickness, which were thinner than the wafers 20; and sliding the polishing pads relatively to the carriers, thereby simultaneously polishing both surfaces of the wafers retained in the carriers. The termination point of polishing was determined by acquiring the vibrations generated from the carriers 10 using vibration detectors 42 provided on the external gears 50; extracting a first signal (a mean value of 200 Hz to 1000 Hz) and a second signal (a mean value of 10 Hz to 100 Hz) from the obtained vibrations; and detecting the timing when the intensity of the first signal is equal to or more than a predetermined value (0.02 A.U.) and the intensity of the second signal is equal to or less than a predetermined value (0.02 A.U).

The polishing conditions (the type of the polishing solution, whether the polishing solution contains a high molecular weight component or not, and the detection method of a polishing termination point) are shown in Table 1. Further, the silicon wafers were polished five times in total (25 sheets).

Example 2

In Example 2, silicon wafers (25 sheets) were polished by a similar method to Example 1 except for that the sounds generated from the carriers 10 were acquired by a sound input microphone 41 provided adjacent to the carriers 10, and a first signal (480 Hz) and a second signal (100 Hz) were extracted from the sounds obtained.

The polishing conditions (the type of the polishing solution, whether the polishing solution contains a high molecular weight component or not, and the detection method of a polishing termination point) are shown in Table 1.

Comparative Example 1

In Comparative Example 1, silicon wafers (25 sheets) were polished under similar conditions to Example 1 except for using a polishing solution containing abrasive grains (a potassium hydroxide aqueous solution containing colloidal silica as free abrasive grains).

The polishing conditions (the type of the polishing solution, whether the polishing solution contains a high molecular weight component or not, and the detection method of a polishing termination point) are shown in Table 1.

Comparative Example 2

In Comparative Example 2, silicon wafers (25 sheets) were polished under similar conditions to Example 1 except for that polishing was controlled not using the information (sounds or vibrations) sourced from the carriers but using a setup time.

The polishing conditions (the type of the polishing solution, whether the polishing solution contains a high molecular weight component or not, and the detection method of a polishing termination point) are shown in Table 1.

EVALUATION METHOD (1) Wear of Carriers

The thickness TC of the carriers in Example 1 and Comparative Example 1 was measured before polishing, after a predetermined time lapse from the beginning of the polishing, and after the polishing. The wear level of the carriers was evaluated by plotting the relationship between the polishing time and the thickness TC of the carriers. The results are shown in FIG. 6 and Table 1.

(2) Thickness variation of Wafers

The thickness profiles of the silicon wafers obtained in Examples and Comparative Examples were measured using WaferSight manufactured by KLA-Tencor Corporation, and the thickness variation of the wafers was calculated. Thus, the mean value of the variation was evaluated. The evaluation results are as shown in Table 1, in which smaller values are better.

TABLE 1

| | Polishing solution | | Detecting method of Polishing termination point | Evaluation | |
|---|---|---|---|---|---|
| | Type | Polymer | | Wear of Carrier | Thickness variation of Wafer ($\mu$m) |
| Example 1 | Without Abrasives | Hydroxyethyl cellulose | Vibration from Carrier | Hardly worn (FIG. 6) | 0.3 |
| Example 2 | Without Abrasives | Hydroxyethyl cellulose | Sounds from Carrier | — | 0.3 |
| Comparative Example 1 | With Abrasives | None | Vibration from Carrier | Badly worn (FIG. 6) | 0.5 |
| Comparative Example 2 | Without Abrasives | Hydroxyethyl cellulose | Time | — | 0.6 |

Table 1 and FIG. 6 show that when polishing was performed by polishing methods of Example 1 and Example 2, the carriers were hardly worn as compared to polishing methods of Comparative Example 1 and Comparative Example 2, and thickness variation of the obtained silicon wafers was small. On the other hand, it is shown that the carriers were badly worn and the thickness variation was large in the polishing method of Comparative Example 1 in which polishing was performed using a polishing solution containing abrasive grains and in the polishing method of Comparative Example 2 in which polishing was controlled using a set time.

INDUSTRIAL APPLICABILITY

The present invention can provide a polishing method capable of suppressing undesired sounds generated from carriers and further reducing thickness variation of silicon wafers after polished.

REFERENCE NUMERALS

10: Carrier
11: Circular Hole
20: Wafer/Silicon Wafer
30: Polishing Pad
40: Detector
41: Sound Input Microphone
42: Vibration Detector
50: External Gear
60: Control Device

The invention claimed is:
1. A wafer polishing method comprising the steps of:
supplying a polishing solution to a surface of a pair of polishing pads positioned above and below a carrier which has a circular hole for retaining a wafer and is thinner than the wafer; and
sliding the polishing pads relatively to the carrier, thereby simultaneously polishing both surfaces of the wafer retained in the carrier,
wherein information sourced from the carrier when a difference between a thickness of the carrier and a thickness of the wafer reaches a predetermined value, is detected to calculate the thickness of the wafer and thereby terminate polishing, wherein the information sourced from the carrier is detected with detectors provided for each carrier.

2. The wafer polishing method according to claim 1, wherein the termination of polishing is performed at a termination point of polishing determined by extracting a first signal and a second signal that are signals of two setup frequency ranges from the information obtained from the carrier, and detecting the termination point of polishing where an intensity of the first signal is higher than a predetermined value and an intensity of the second signal is lower than a predetermined value.

3. The wafer polishing method according to claim 1, wherein the polishing solution is a polishing solution free of abrasive grains.

4. The wafer polishing method according claim 1, wherein the information sourced from the carrier is sounds and/or vibrations.

5. The wafer polishing method according claim 1, wherein the difference between the thickness of the carrier and the thickness of the wafer at a time when the information is sourced, is in the range of 0.1 µm to 20 µm.

6. The wafer polishing method according claim 1, wherein a pressure applied to the polishing pads in the direction perpendicular to the surfaces of the wafer is in the range of 100 g/cm$^2$ to 300 g/cm$^2$.

7. The wafer polishing method according to claim 1, wherein the detector is provided on a mechanism for holding the carrier.

8. The wafer polishing method according to claim 7, wherein the detector is provided on external gears for moving the carrier.

9. The wafer polishing method according to claim 4, wherein the detection of the sounds from the carrier is performed by detecting sounds having a frequency of 10 Hz to 1000 Hz.

10. The wafer polishing method according to claim 1, wherein the polishing solution contains a specific high molecular weight component.

11. The wafer polishing method according to claim 2, wherein the extracting the signals from the information is calculation of a power spectra of digital data obtained by A/D converting the detected information and of a mean value or a maximum value of signal intensities of power spectra corresponding to the setup frequency ranges.

* * * * *